(12) United States Patent
Jin et al.

(10) Patent No.: US 10,917,970 B2
(45) Date of Patent: Feb. 9, 2021

(54) DISPLAY PANEL AND DISPLAY

(71) Applicant: Shenzhen China Star Optoelectronics Semiconductor Display Technology Co., Ltd., Shenzhen (CN)

(72) Inventors: Yufeng Jin, Shenzhen (CN); Shen-sian Syu, Shenzhen (CN); Ming-jong Jou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 328 days.

(21) Appl. No.: 15/744,274

(22) PCT Filed: Dec. 22, 2017

(86) PCT No.: PCT/CN2017/117357
§ 371 (c)(1),
(2) Date: Oct. 4, 2018

(87) PCT Pub. No.: WO2019/095500
PCT Pub. Date: May 23, 2019

(65) Prior Publication Data
US 2020/0045820 A1  Feb. 6, 2020

(30) Foreign Application Priority Data

Nov. 20, 2017  (CN) .......................... 2017 1 1161465

(51) Int. Cl.
*H05K 1/14*  (2006.01)
*H05K 1/18*  (2006.01)
(Continued)

(52) U.S. Cl.
CPC ............. *H05K 1/147* (2013.01); *H05K 1/189* (2013.01); *H05K 5/0017* (2013.01); *H05K 7/20963* (2013.01); *H05K 2201/10128* (2013.01)

(58) Field of Classification Search
CPC ...... H05K 1/147; H05K 1/189; H05K 5/0017; H05K 7/20963; H05K 2201/10128; H05K 3/0067
(Continued)

(56) References Cited

U.S. PATENT DOCUMENTS 6,292,248 B1 * 9/2001 Lee ..................... G02F 1/13452
349/149
8,134,676 B2  3/2012 Shim
(Continued)

FOREIGN PATENT DOCUMENTS

CN  1497296 A  5/2004
CN  101118330 A  2/2008
(Continued)

*Primary Examiner* — Sherman Ng
(74) *Attorney, Agent, or Firm* — Brinks Gilson & Lione

(57) ABSTRACT

A display panel and a display are provided. The display panel includes a glass substrate, at least one driving chip and a flexible printed circuit, wherein the at least one driving chip is electrically connected to the flexible printed circuit. Both the at least one driving chip and the flexible printed circuit are arranged on the glass substrate together to reduce the thickness of the display.

15 Claims, 4 Drawing Sheets

(51) Int. Cl.
*H05K 5/00* (2006.01)
*H05K 7/20* (2006.01)

(58) Field of Classification Search
USPC .......................................................... 174/254
See application file for complete search history.

(56) References Cited

U.S. PATENT DOCUMENTS

| | | | |
|---|---|---|---|
| 9,470,379 B2 | 10/2016 | Jang et al. | |
| 2005/0078459 A1* | 4/2005 | Yeon | H05K 1/028 |
| | | | 361/749 |
| 2007/0081117 A1* | 4/2007 | Liu | G09G 3/3674 |
| | | | 349/150 |
| 2011/0097962 A1 | 4/2011 | Yuge | |
| 2011/0285679 A1 | 11/2011 | Oh et al. | |
| 2012/0320002 A1* | 12/2012 | Hsu | G02F 1/13452 |
| | | | 345/204 |
| 2015/0268779 A1* | 9/2015 | Yang | G06F 3/0443 |
| | | | 345/173 |
| 2015/0316810 A1* | 11/2015 | Shibahara | G02F 1/133382 |
| | | | 349/150 |
| 2016/0349564 A1 | 12/2016 | Nagashima et al. | |
| 2017/0192285 A1 | 7/2017 | Shibahara | |
| 2018/0122303 A1* | 5/2018 | Tsai | G02F 1/13452 |

FOREIGN PATENT DOCUMENTS

| | | |
|---|---|---|
| CN | 203276737 U | 11/2013 |
| CN | 204087052 U | 7/2015 |
| CN | 106501983 A | 3/2017 |
| CN | 206134140 U | 4/2017 |
| CN | 107331294 A | 11/2017 |

\* cited by examiner

DISPLAY PANEL AND DISPLAY

CROSS-REFERENCE TO RELATED APPLICATIONS

The present application is a 35 U.S.C. § 371 National Phase conversion of International (PCT) Patent Application No. PCT/CN2017/117357 filed Dec. 20, 2017, which claims foreign priority to Chinese Patent Application No. 201711161465.5, filed on Nov. 20, 2017 in the State Intellectual Property Office of China, the contents of which are hereby incorporated by reference.

TECHNICAL FIELD

The present disclosure generally relates to display technology, and in particular to a display panel and a display.

BACKGROUND

In recent years, the development of television and other displays has been changing with each passing day, while the popularity of display is getting higher and higher, today's customer demand for display is also getting higher and higher. For example, the application of television can be placed on the table, embedded in the wall, or hung on the glass door and so on. Such as from the beginning flow-to-ceiling television to today's common wall-mounted television.

In order to meet the needs of consumers, the thickness of the display becomes even more important, the future trend of the display will be to maintain high definition, while the thickness will continue to decrease, giving consumers a better consumer experience.

SUMMARY

Embodiments of the present disclosure provide a display panel and a display to solve the problem that the thickness of the display panel in the prior art is too large.

In order to solve the technical problem mentioned above, the present disclosure provides a display panel including a glass substrate, at least one driving chip and a flexible printed circuit. The at least one driving chip is electrically connected to the flexible printed circuit, and the flexible printed circuit is arranged on the glass substrate, the at least one driving chip is arranged on the flexible printed circuit by a COF process. The glass substrate comprises a sub-region defined thereon, the size of the sub-region is 5%~20% of that of the glass substrate, and the at least one driving chip is arranged in the sub-region in an array.

In order to solve the technical problem mentioned above, the present disclosure provides another display panel including a glass substrate, at least one driving chip and a flexible printed circuit. The at least one driving chip is electrically connected to the flexible printed circuit, and the at least one driving chip and the flexible printed circuit are arranged on the glass substrate together.

In order to solve the technical problem mentioned above, the present disclosure also provides a display including a control circuit board and a display panel. The display panel includes a glass substrate, at least one driving chip and a flexible printed circuit, with the at least one driving chip being electrically connected to the flexible printed circuit. The at least one driving chip and the flexible printed circuit are arranged on the glass substrate together, and the control circuit board is connected to the flexible printed circuit to be electrically connected to the at least one driving chip through the flexible printed circuit.

The display panel of the present disclosure includes a glass substrate, a driving chip and a flexible printed circuit, the driving chip is electrically connected to the flexible printed circuit, the driving chip and the flexible circuit are arranged on the glass substrate together, the driving chip can directly connected to control circuit and other external circuits through the flexible printed circuit, the thickness of the display is the sum of the thickness of the glass substrate, the thickness of the driving chip and the thickness of the flexible printed circuit, the thickness of the display is smaller, realizing the light and thin of the display panel, reducing the thickness of the display.

DETAILED DESCRIPTION

The technical solutions in the embodiments of the present disclosure will be clearly and completely described in connection with the drawings in the embodiments of the present disclosure. Obviously, the embodiments described here are merely using to explain the present disclosure, not to limit the present disclosure, it also needs to be explained that for the convenience of description, the drawings merely show parts of the present disclosure, not all parts. Based on the embodiments in the present disclosure, all other embodiments can be obtained by those skilled in the art without making any creative work are within the scope of the protection of the present disclosure.

The display panel of the present disclosure includes a glass substrate, a driving chip and a flexible printed circuit. The driving chip electrical is connected to the flexible printed circuit, a external control circuit is connected to the flexible printed circuit, to drive the display of the display panel by the driving chip.

The driving chip and the flexible printed circuit are arranged in a stacked manner on the glass substrate together, that is, the driving chip is arranged on the flexible printed circuit, the flexible printed circuit is further arranged on the glass substrate, or the driving chip is arranged on the glass substrate, the flexible circuit is arranged on the glass substrate with covering the driving chip.

Figure 1:
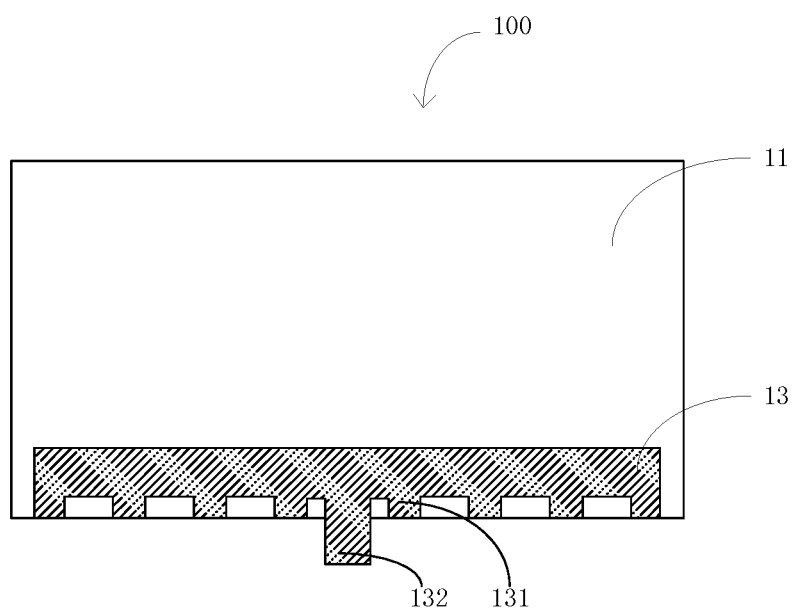
FIG. 1 is a schematic diagram of a display panel according to an embodiment of the present disclosure.
Figure 2:
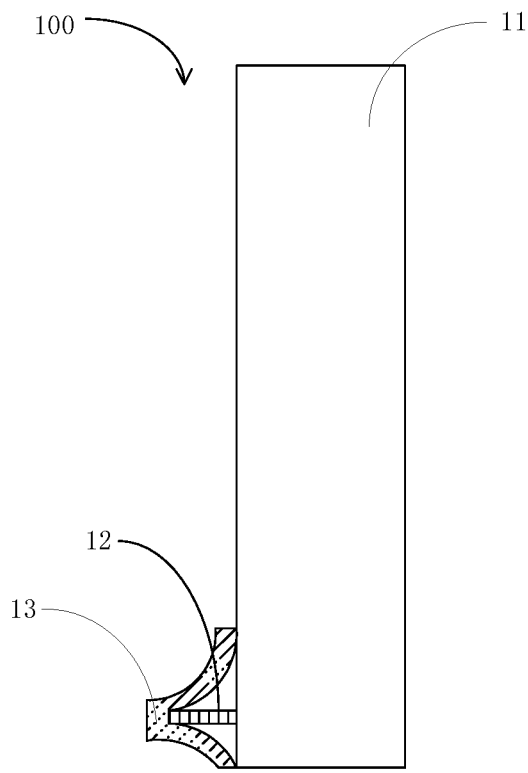
FIG. 2 is a side view of the display panel shown in FIG. 1.

The above two stacking methods are achieved by different processes, for the case where the driving chip is arranged on the glass substrate and the flexible circuit is arranged on the glass substrate with covering the driving chip, referring to FIG. 1 and FIG. 2, FIG. 1 is a schematic diagram of a display panel according to an embodiment of the present disclosure, FIG. 2 is a side view of the display panel shown in FIG. 1.

A display panel 100 of the present embodiment may include a glass substrate 11, a driving chip 12 and a flexible printed circuit 13. The driving chip 12 is arranged on the glass substrate 11 by a COG (Chip on Glass) process, the flexible printed circuit 13 is arranged on the driving chip 12 and the glass substrate 11.

COG process is about the process that the chip bonding directly on the glass. In the present embodiment first arranging a ACF conductive adhesive on the glass substrate 11, then aligning the driving chip 12 and the glass substrate 11, the conductive adhesive is located between the driving chip 12 and the glass substrate 11, bonds the driving chip 12 and the glass substrate 11 together by a thermal head.

After the driving chip 12 is formed on the glass substrate 11 by the COG process, the flexible printed circuit 13 and the glass substrate 11 are then bonded to achieve the electrically connection of the flexible printed circuit 13 and the driving chip 12.

The flexible printed circuit 13 is electrically connected to the driving chip 12, also needs to be electrically connected to the external control circuit board. Therefore, the flexible printed circuit 13 includes a main portion 131 arranged on the glass substrate 11 and a connecting portion 132 out of the glass substrate 11, the main portion 131 is electrically connected to the driving chip 12, and the connecting portion 132 is for electrically connecting to the external control circuit board.

In the present embodiment, the display panel 100 may include a plurality of driving chips 12. The driving chips 12 are arranged on one side of the glass substrate 11 in a line. As shown in FIG. 1, the driving chips 12 are arranged on the bottom of the glass substrate 11, for driving the column driving lines of the display panel 100. Correspondingly a driving chip is also arranged on the side of the glass substrate 11 for driving the row driving lines, which is not shown in the figure.

In the present embodiment, the driving chip 12 is arranged on the glass substrate 11 by the COG process, and achieve to directly be connected to the external control circuit board through the flexible printed circuit 13, that is the driving chip 12 does not need to be connected to the external control circuit board by a printed circuit board and a connector. Correspondingly, in the present embodiment, the thickness of the display panel, that is, the sum of the thicknesses of the driving chip and the flexible printed circuit which is smaller than the sum of the thicknesses of the printed circuit board and the connector. The thickness of the driving chip is about 0.7 mm, and the thickness of the flexible printed circuit is about 0.1 mm, and the thickness of the printed circuit board is about 1 mm, and the thickness of the connector is greater than 1 mm. Therefore, the display panel of the present embodiment can achieve a slimmer design.

Figure 3:
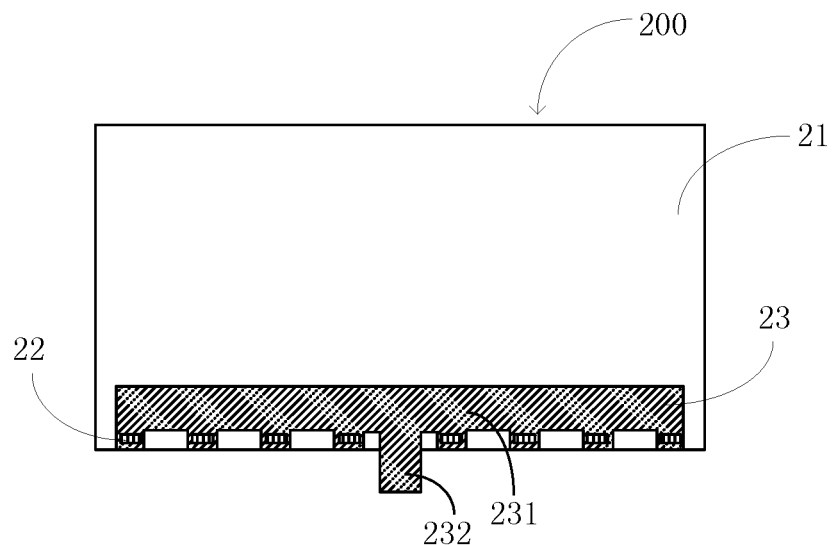
FIG. 3 is a schematic diagram of a display panel according to another embodiment of the present disclosure.
Figure 4:
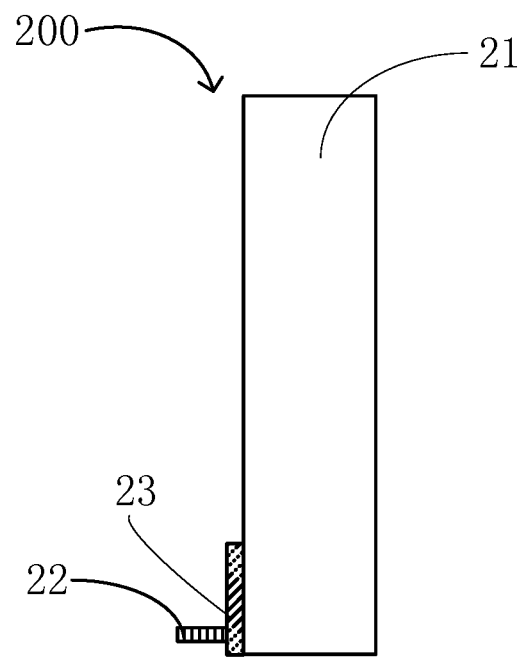
FIG. 4 is a side view of the display panel shown in FIG. 3.

For the case where the driving chip is arranged on the glass substrate, the flexible circuit is arranged on the glass substrate with covering the driving chip, referring to FIG. 3 and FIG. 4, FIG. 3 is a schematic diagram of a display panel according to another embodiment of the present disclosure, FIG. 4 is a side view of the display panel shown in FIG. 3.

A display panel 200 of the present embodiment may includes a glass substrate 21, a driving chip 22 and a flexible printed circuit 23. The flexible printed circuit 23 is arranged on the glass substrate 21, the driving chip is arranged on the flexible printed circuit 23 by a COF (Chip on Film) process.

COF (Chip on Film) process is about the chip directly packaged on the flexible printed circuit. Similar to the COG process, in the present embodiment, the driving chip 22 is also connected to the flexible printed circuit 23 through an ACF conductive adhesive.

In the present embodiment, the flexible printed circuit 23 is firstly bonded to the glass substrate 21, and then the driving chip 22 is formed on the flexible printed board 23 by the COF process and electrically connected to the flexible printed circuit 23.

The flexible printed circuit 23 in the present embodiment also includes a main portion 231 and a connecting portion 232, similar to the embodiment shown in FIG. 1. The display panel 200 may includes a plurality of driving chips 22 arranged on one side of the glass substrate 21. The illustrated embodiment is similar, and details are not described herein again.

In the present embodiment, the flexible printed board 23 is firstly bonded to the glass substrate 21, and then the driving chip 22 is arranged on the flexible printed board 23 by the COF process. Due to in the COF process, the driving chip 22 and the flexible printed board 23 need to be aligned. Therefore, the accuracy of the flexible printed board 23 is higher demanded in the present embodiment.

Compared with the case of the embodiment shown in FIG. 1, the driving chip 12 in FIG. 1 is aligned with the glass substrate 11 in the COG process, the flexible printed board 13 is bonded to the correct position based on the glass substrate 11 to achieve the electrical connection with the driving chip 12, and the structure of the driving chip 12 does not need a high-precision design. Therefore, the embodiment shown in FIG. 3 has higher requirements on the precision of the flexible printed board.

In the present embodiment, the display panel is similar to the one shown in FIG. 1. The thickness of the display panel is the sum of the thicknesses of the driving chip and the flexible printed board, so that the light-weight design can be realized.

Figure 5:
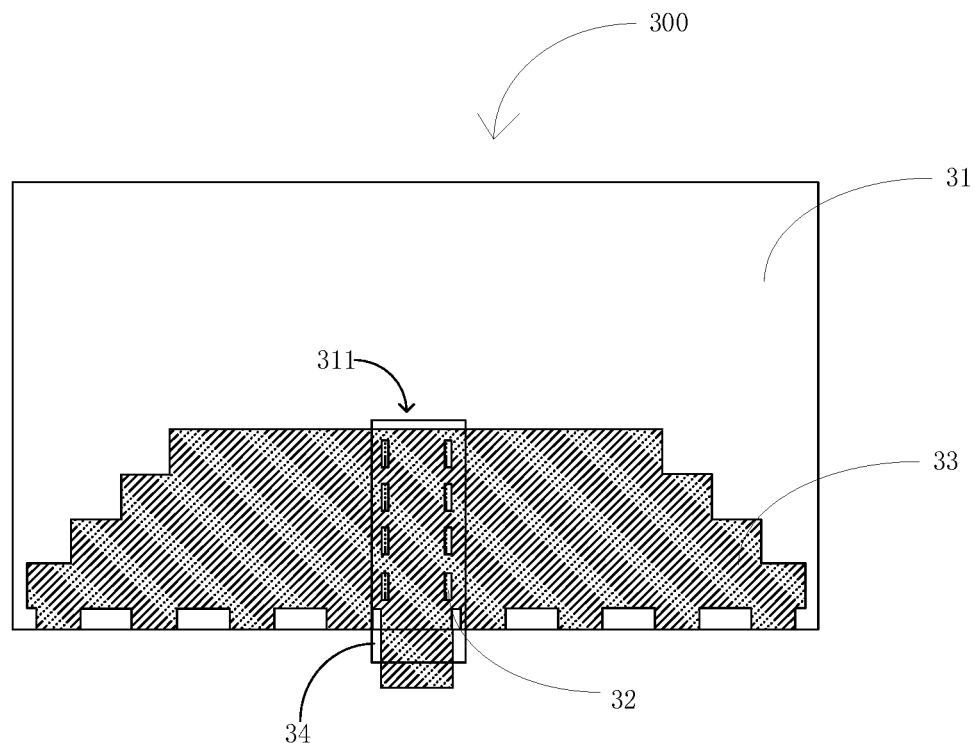
FIG. 5 is a schematic diagram of a display panel according to another embodiment of the present disclosure.
Figure 6:
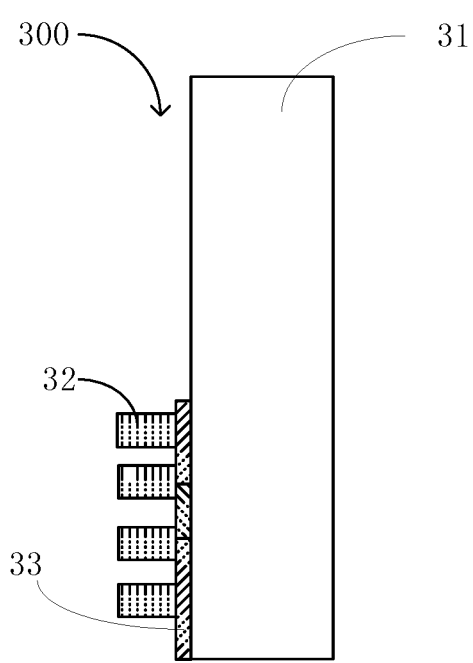
FIG. 6 is a side view of the display panel shown in FIG. 4.

When the display panel is large, the driving chips arranged on one side of the glass substrate are not easy to dissipate heat. Therefore, different arrangements for driving the chips are also proposed in the present disclosure. Please refer to FIG. 5 and FIG. 6. FIG. 5 is a schematic diagram of a display panel according to another embodiment of the present disclosure, FIG. 6 is a side view of the display panel shown in FIG. 4.

In the embodiment shown in FIG. 5, the display panel 300 includes a glass substrate 31, a driving chip 32 and a flexible printed board 33. The interrelation among the three is similar to the embodiment shown in FIG. 3, that is, the flexible printed board 33 is arranged on the glass substrate 31, the driving chip 32 is arranged on the flexible printed board 33 by the COF process, and the description of the same parts of the two embodiments will not be repeated here.

The difference lies in that the glass substrate 31 of the display panel 300 in the present embodiment defines a sub-region 311, and the plurality of driving chips 32 are no longer arranged on one side of the glass substrate 31, but arranged in the sub-region 311. Specifically, arranged in the sub-region 311 in an array.

The size of the sub-region 311 is 5%~20% of that of the glass substrate 31. That is, in the present embodiment, the driving chips 32 of the display panel 300 are collectively arranged. Therefore, when the plurality of driving chips 32 need dissipated, only arrange one heat dissipating module 34 for the display panel 300 can dissipate heat to the plurality of driving chips 32 at the same time.

If the plurality of driving chips 32 are arranged in one sub-region, the shape of the flexible printed board 33 will be more complicated due to the requirement of wiring. Therefore, the glass substrate 31 of the display panel 300 of the embodiment may also defines a plurality of sub-regions. The plurality of driving chips 32 are grouply arranged in the plurality of sub-regions 311 so as to prevent the wiring the flexible printed board 33 from being overly complicated. One heat dissipation module 34 is arranged correspondingly in each sub-region 311 in the display panel 300.

In the present embodiment, the display panel can also achieve the light and thin design, and at the same time, the driving chip can be centrally arranged to conveniently dissipate heat.

Figure 7:
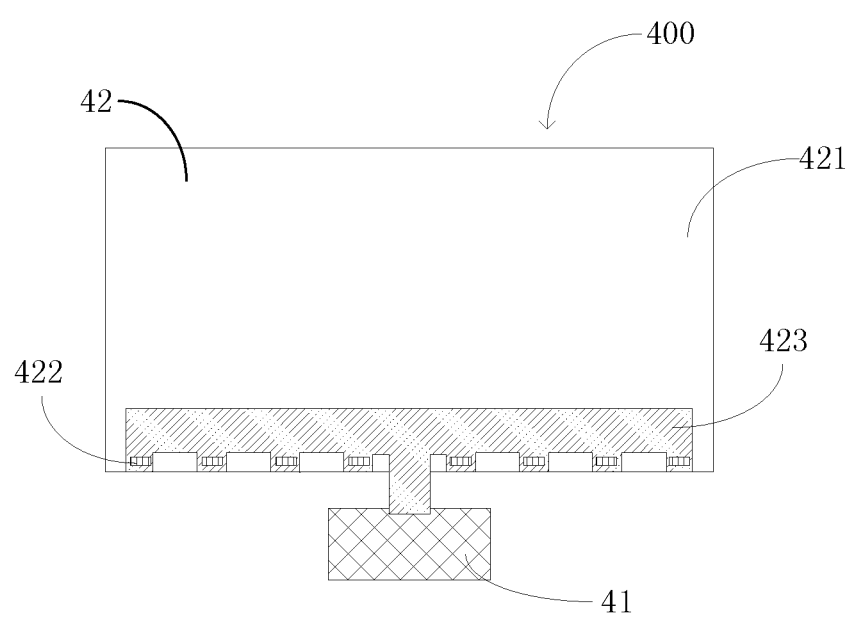
FIG. 7 is a schematic diagram of a display according to an embodiment of the present disclosure.

The present disclosure further provides a display. Referring to FIG. 7, FIG. 7 is a schematic diagram of a display according to an embodiment of the present disclosure. The display 400 in the present embodiment includes a control circuit board 41 and a display panel 42. The display panel 42 includes a glass substrate 421, a driving chip 422, and a flexible printed board 423. The driving chip 422 and the flexible printed board 423 are commonly arranged on the glass substrate 421. The control circuit board 41 is connected to the flexible printed board 423 to be electrically connected to the driving chip 422 through the flexible printed board 423.

In the present embodiment, the control circuit board 41 is a printed circuit board. The control circuit board 41 can be connected to the flexible printed board 423 through a connector, the control circuit board 41 can also be connected to the flexible printed board 423 by a soft-hard bonding process. No additional connectors are required.

In the present embodiment, the display panel 42 may be the display panel 100/200/300 of the above embodiments. That is, the driving chip 422 may be arranged on the glass substrate 421 by the COG process, the flexible printed board 423 is disposed on the driving chip 422 and the glass substrate 421. Alternatively, the flexible printed board 423 is arranged on the glass substrate 421, and the driving chip 422 is arranged on the flexible printed board 423 by the COF process. Specifically, the display panel 42 shown in FIG. 7 adopts the structure of the display panel 200.

The display panel used in the display of the embodiment can achieve the light and thin design, and can also to reduce the thickness of the display.

The above description depicts merely some exemplary embodiments of the disclosure, but is meant to limit the scope of the disclosure. Any equivalent structure or flow transformations made to the disclosure, or any direct or indirect applications of the disclosure on other related fields, shall all be covered within the protection of the disclosure.

What is claimed is:

1. A display panel, comprising; a glass substrate containing a sub-region defined thereon, the sub-region comprising 5%~20% of the glass substrate; a plurality of driving chips and a flexible printed circuit arranged on the glass substrate, wherein, the plurality of driving chips are electrically connected to the flexible printed circuit, and the plurality of driving chips are deposited on the flexible printed circuit by a Chip On Film ("COF") process, wherein the plurality of driving chips are arranged in the sub-region in an array, and wherein the driving chip further comprises a heat dissipation module, the heat dissipation module is arranged on the at least one driving chip, the flexible printed circuit, and the glass substrate.

2. The display panel according to claim 1, wherein a thickness of the driving chip is 0.7 mm, a thickness of the flexible printed circuit is 0.1 mm.

3. A display panel, comprising: a glass substrate containing a sub-region defined thereon, the sub-region comprises 5%~20% of the glass substrate; a plurality of driving chips; and a flexible printed circuit, wherein, the plurality of driving chips are electrically connected to the flexible printed circuit, and the plurality of driving chips and the flexible printed circuit are both arranged on the glass substrate, wherein the plurality of driving chips are arranged in the sub-region in an array, and wherein the driving chip further comprises a heat dissipation module, the heat dissipation module is arranged on the at least one driving chip, the flexible printed circuit, and the glass substrate.

4. The display panel according to claim 3, wherein the plurality of driving chips are arranged on the glass substrate by a Chip On Glass ("COG") process, and the flexible printed circuit is arranged on the driving chip and the glass substrate.

5. The display panel according to claim 3, wherein the flexible printed circuit is arranged on the glass substrate, the plurality of driving chips are arranged on the flexible printed circuit by a Chip On Film ("COF") process.

6. The display panel according to claim 3, wherein the plurality of driving chips are arranged on a same side of the glass substrate.

7. The display panel according to claim 3, wherein a thickness of the driving chip is 0.7 mm, a thickness of the flexible printed circuit is 0.1 mm.

8. A display comprising, a control circuit board; and a display panel, wherein, the display panel comprising: a glass substrate containing a sub-region defined thereon, the sub-region comprises 5%~20% of the glass substrate; a plurality of driving chips; and a flexible printed circuit, wherein, the plurality of driving chips are electrically connected to the flexible printed circuit, and the plurality of driving chips and the flexible printed circuit are both arranged on the glass substrate, and the control circuit board is connected to the flexible printed circuit and is further electrically connected to the plurality of driving chips through the flexible printed circuit, wherein the plurality of driving chips are arranged in the sub-region in an array, and wherein the driving chip further comprises a heat dissipation module, the heat dissipation module is arranged on the at least one driving chip, the flexible printed circuit, and the glass substrate.

9. The display according to claim 8, wherein the control circuit board is a printed circuit board, the control circuit board is connected to the flexible printed circuit by a soft-hard bonding process.

10. The display according to claim 8, wherein the plurality of driving chips are arranged on the glass substrate by a Chip On Glass ("COG") process, the flexible printed circuit is arranged on the driving chip and the glass substrate.

11. The display according to claim 8, wherein the flexible printed circuit is arranged on the glass substrate, the plurality of driving chips are arranged on the flexible printed circuit by a Chip On Film ("COF") process.

12. The display according to claim 8, wherein the plurality of driving chips are driving chips are arranged on a same side of the glass substrate.

13. The display according to claim 8, wherein the flexible printed circuit comprises a main portion and a connecting portion, the main portion is electrically connected to the plurality of driving chips, the connecting portion is electrically connected to the control circuit board.

14. The display according to claim 13, wherein the main portion is arranged on the glass substrate, the connecting portion is arranged outside the glass substrate.

15. The display according to claim 8, wherein a thickness of the driving chip is 0.7 mm, a thickness of the flexible printed circuit is 0.1 mm.

\* \* \* \* \*